US011942506B2

(12) United States Patent
Takagi et al.

(10) Patent No.: US 11,942,506 B2
(45) Date of Patent: Mar. 26, 2024

(54) SOLID STATE IMAGING DEVICE

(71) Applicant: HAMAMATSU PHOTONICS K.K., Hamamatsu (JP)

(72) Inventors: Shin-ichiro Takagi, Hamamatsu (JP); Mitsuhito Mase, Hamamatsu (JP); Jun Hiramitsu, Hamamatsu (JP); Yasuhito Yoneta, Hamamatsu (JP); Masaharu Muramatsu, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 118 days.

(21) Appl. No.: 16/643,110

(22) PCT Filed: Jul. 19, 2018

(86) PCT No.: PCT/JP2018/027111
§ 371 (c)(1),
(2) Date: Feb. 28, 2020

(87) PCT Pub. No.: WO2019/044246
PCT Pub. Date: Mar. 7, 2019

(65) Prior Publication Data
US 2020/0212098 A1    Jul. 2, 2020

(30) Foreign Application Priority Data

Sep. 4, 2017  (JP) ................................. 2017-169466

(51) Int. Cl.
*H01L 27/148*  (2006.01)
*H01L 27/146*  (2006.01)
(Continued)

(52) U.S. Cl.
CPC .. *H01L 27/14843* (2013.01); *H01L 27/14603* (2013.01); *H01L 27/14607* (2013.01);
(Continued)

(58) Field of Classification Search
CPC ......... H01L 27/14843; H01L 27/14603; H01L 27/14607; H01L 27/14812
See application file for complete search history.

(56) References Cited

U.S. PATENT DOCUMENTS

| | | |
|---|---|---|
| 2002/0100887 A1 | 8/2002 | Hagiwara et al. |
| 2011/0050971 A1 | 3/2011 | Takatsuka et al. |

(Continued)

FOREIGN PATENT DOCUMENTS

| | | |
|---|---|---|
| EP | 3067934 A1 | 9/2016 |
| JP | 2002-231926 A | 8/2002 |

(Continued)

OTHER PUBLICATIONS

International Preliminary Report on Patentability dated Mar. 19, 2020 for PCT/JP2018/027111.

*Primary Examiner* — Aaron J Gray
(74) *Attorney, Agent, or Firm* — Faegre Drinker Biddle & Reath LLP

(57) ABSTRACT

The photosensitive region includes a first impurity region and a second impurity region having a higher impurity concentration than that of the first impurity region. The photosensitive region includes one end positioned away from the transfer section in the second direction and another end positioned closer to the transfer section in the second direction. A shape of the second impurity region in plan view is line-symmetric with respect to a center line of the photosensitive region along the second direction. A width of the second impurity region in the first direction increases in a transfer direction from the one end to the other end. An increase rate of the width of the second impurity region in each of sections, obtained by dividing the photosensitive region into n sections in the second direction, becomes gradually higher in the transfer direction. Here, n is an integer of two or more.

7 Claims, 14 Drawing Sheets

(51) Int. Cl.
*H04N 25/71* (2023.01)
*H04N 25/73* (2023.01)

(52) U.S. Cl.
CPC ....... *H01L 27/14812* (2013.01); *H04N 25/71* (2023.01); *H01L 27/14831* (2013.01); *H04N 25/73* (2023.01)

(56) References Cited

U.S. PATENT DOCUMENTS

| | | | | |
|---|---|---|---|---|
| 2011/0187908 | A1* | 8/2011 | Kawahito | H01L 27/14612 250/214 R |
| 2015/0014749 | A1* | 1/2015 | Ushinaga | H01L 27/14812 257/222 |
| 2016/0268334 | A1* | 9/2016 | Takagi | H01L 27/14825 |

FOREIGN PATENT DOCUMENTS

| | | |
|---|---|---|
| JP | 2009-070902 A | 4/2009 |
| JP | 2010-040594 A | 2/2010 |
| JP | 2010-103197 A | 5/2010 |
| JP | 2011-054596 A | 3/2011 |
| JP | 2013-172136 A | 9/2013 |
| JP | 2015-090906 A | 5/2015 |
| JP | 2015-090907 A | 5/2015 |
| TW | 201523859 A | 6/2015 |

* cited by examiner

Fig.11
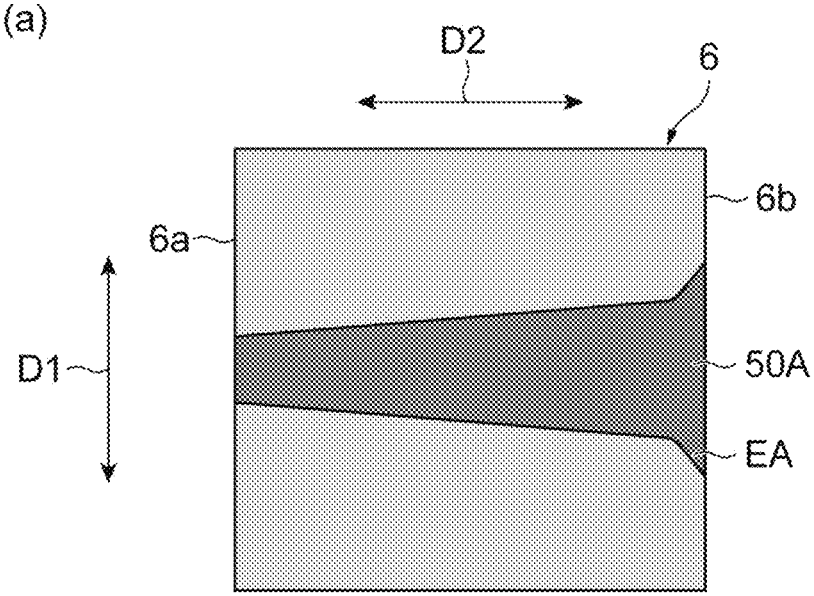
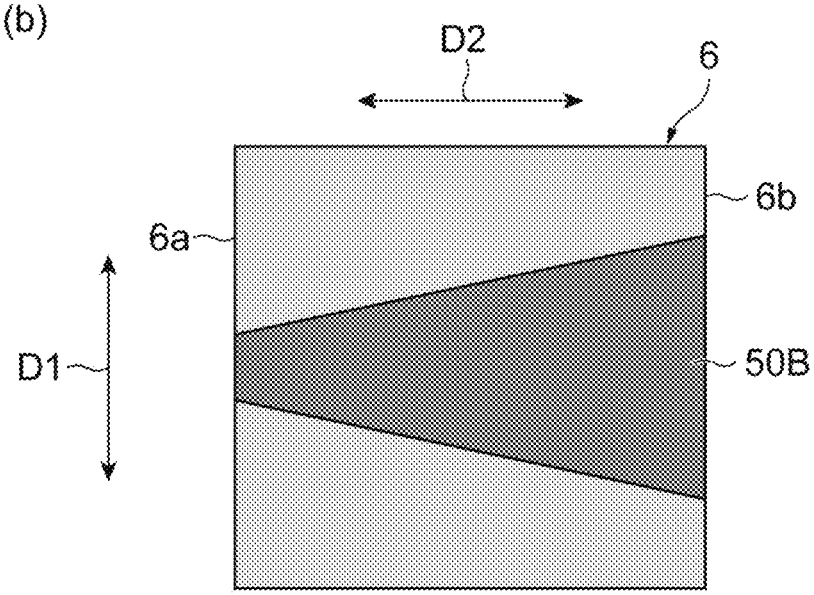

SOLID STATE IMAGING DEVICE

TECHNICAL FIELD

The present invention relates to a solid state imaging device.

BACKGROUND ART

Known solid state imaging devices include a plurality of photoelectric conversion sections distributed in a first direction and a plurality of transfer sections distributed in a second direction intersecting the first direction with corresponding photoelectric conversion sections of the plurality of photoelectric conversion sections (for example, see Patent Literature 1). Each of the photoelectric conversion sections includes a photosensitive region arranged to generate a charge in response to incident light. Each of the transfer sections is arranged to transfer the charge generated in the corresponding photoelectric conversion section.

CITATION LIST

Patent Literature

Patent Literature 1: Japanese Unexamined Patent Publication No. 2015-90906

SUMMARY OF INVENTION

Technical Problem

In the solid state imaging device, a distance to transfer the charge in the photoelectric conversion section increases, for example, in a case in which a length of the photoelectric conversion section in the second direction is increased. In this case, the photoelectric conversion section needs to transfer the charge efficiently. In order to transfer the charge efficiently, for example, an impurity is additionally implanted into the photoelectric section to change an impurity concentration of the photosensitive region. The photosensitive region of the above solid state imaging device includes a first impurity region and a second impurity region having a higher impurity concentration than that of the first impurity region. The photosensitive region includes one end positioned away from the transfer section in the second direction and another end positioned closer to the transfer section in the second direction. A direction from one end to the other end is a transfer direction of the charge. The second impurity region has a trapezoidal shape in which a width in the second direction gradually increases in the transfer direction. The second impurity region forms an electrical potential gradient, which gradually increases in the transfer direction, in the photosensitive region.

The electrical potential gradient formed in the photosensitive region may change depending on a shape of the second impurity region. Designers often determine the shape of the second impurity region based on their own sense or experience. In this case, the second impurity region tends not to form an electrical potential gradient sufficient to efficiently transfer the charge, and thus, the charge transfer time may increase. Therefore, further improvement in charge transfer efficiency is required.

An object of one aspect of the present invention is to provide a solid state imaging device that improves charge transfer efficiency.

Solution to Problem

The present inventors have newly obtained the following knowledge. For example, in a case in which the second impurity region has a trapezoidal shape, a portion having a small electrical potential gradient is generated in the photosensitive region. In a case in which the shape of the second impurity region is a shape where the portion having a small electrical potential gradient is unlikely to be generated, the charge transfer efficiency is improved. The present inventors have intensively studied the shape where the portion having a small electrical potential gradient is unlikely to be generated based on the above-described knowledge, and have completed the present invention.

One aspect of the present invention is a solid state imaging device including a plurality of photoelectric conversion sections distributed in a first direction and a plurality of transfer sections distributed in a second direction intersecting the first direction with corresponding photoelectric conversion sections of the plurality of photoelectric conversion sections. The plurality of photoelectric conversion sections includes photosensitive regions arranged to generate a charge in response to incident light. The plurality of transfer sections is arranged to transfer the charge generated in the corresponding photoelectric conversion sections. The photosensitive region includes a first impurity region and a second impurity region having a higher impurity concentration than that of the first impurity region. The photosensitive region includes one end positioned away from the transfer section in the second direction and another end positioned closer to the transfer section in the second direction. The second impurity region is provided from the one end of the photosensitive region or a vicinity of the one end to the other end of the photosensitive region. The second impurity region has a shape that is line-symmetric with respect to a center line of the photosensitive region along the second direction in plan view. A width of the second impurity region in the first direction increases in a transfer direction from the one end to the other end. An increase rate of the width of the second impurity region in each of sections, obtained by dividing the photosensitive region into n sections in the second direction, becomes gradually higher in the transfer direction. Here, n is an integer of two or more.

In the one aspect, the width of the second impurity region increases in the transfer direction. Therefore, an electrical potential gradient in which an electrical potential increases from the one end to the other end is formed in the photosensitive region. The second impurity region has a shape that is line-symmetric with respect to a center line of the photosensitive region along the second direction in plan view. Therefore, the charge is transferred with the same efficiency in the photosensitive region regardless of a position where the charge is generated. The increase rate of the width of the second impurity region in each of the sections, obtained by dividing the photosensitive region into n sections in the second direction, becomes gradually higher in the transfer direction. In this case, a shape of the second impurity region is a shape in which a portion having a small electrical potential gradient is unlikely to be generated in the photosensitive region. The photoelectric conversion section efficiently transfers the charge. Therefore, the solid state imaging device of the one aspect improves charge transfer efficiency.

In the one aspect, the width of the second impurity region in each of the sections may be set such that an electrical potential difference in the photosensitive region between adjacent sections of the sections is constant. In this case, the electrical potential gradient in the photosensitive region is approximately constant. Therefore, the photoelectric conversion section transfers the charge more efficiently.

In the one aspect, each of the sections may be a section obtained by equally dividing the photosensitive region into n sections in the second direction. In this case, n is an integer of two or more.

In the one aspect, each of the sections may be a section obtained by dividing the photosensitive region such that a width in the second direction becomes gradually narrower in the transfer direction.

In the one aspect, an increase rate of the width of the second impurity region may change in such a manner as to increase near the other end, in the section closest to the other end.

Advantageous Effects of Invention

According to one aspect of the present invention, the solid state imaging device that improves the charge transfer efficiency is provided.

BRIEF DESCRIPTION OF DRAWINGS

FIG. 11 is a schematic view illustrating second impurity regions according to reference examples.

DESCRIPTION OF EMBODIMENTS

Hereinafter, embodiments of the present invention will be described in detail with reference to the accompanying drawings. The same reference signs will be used for the same elements or elements having the same functions in the description, and redundant descriptions will be omitted.

Figure 1:
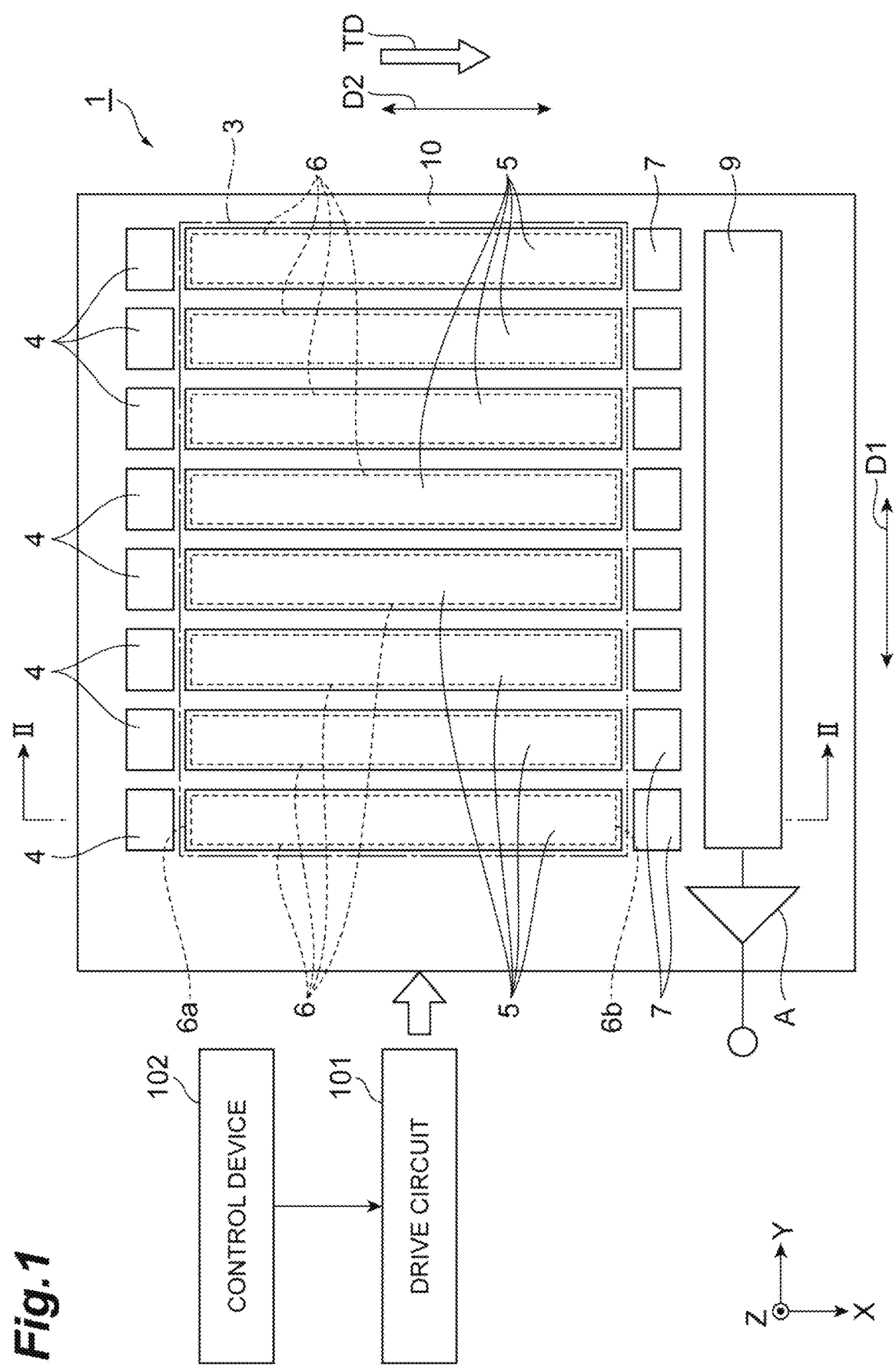
FIG. 1 is a view illustrating a planar configuration of a solid state imaging device.
Figure 2:
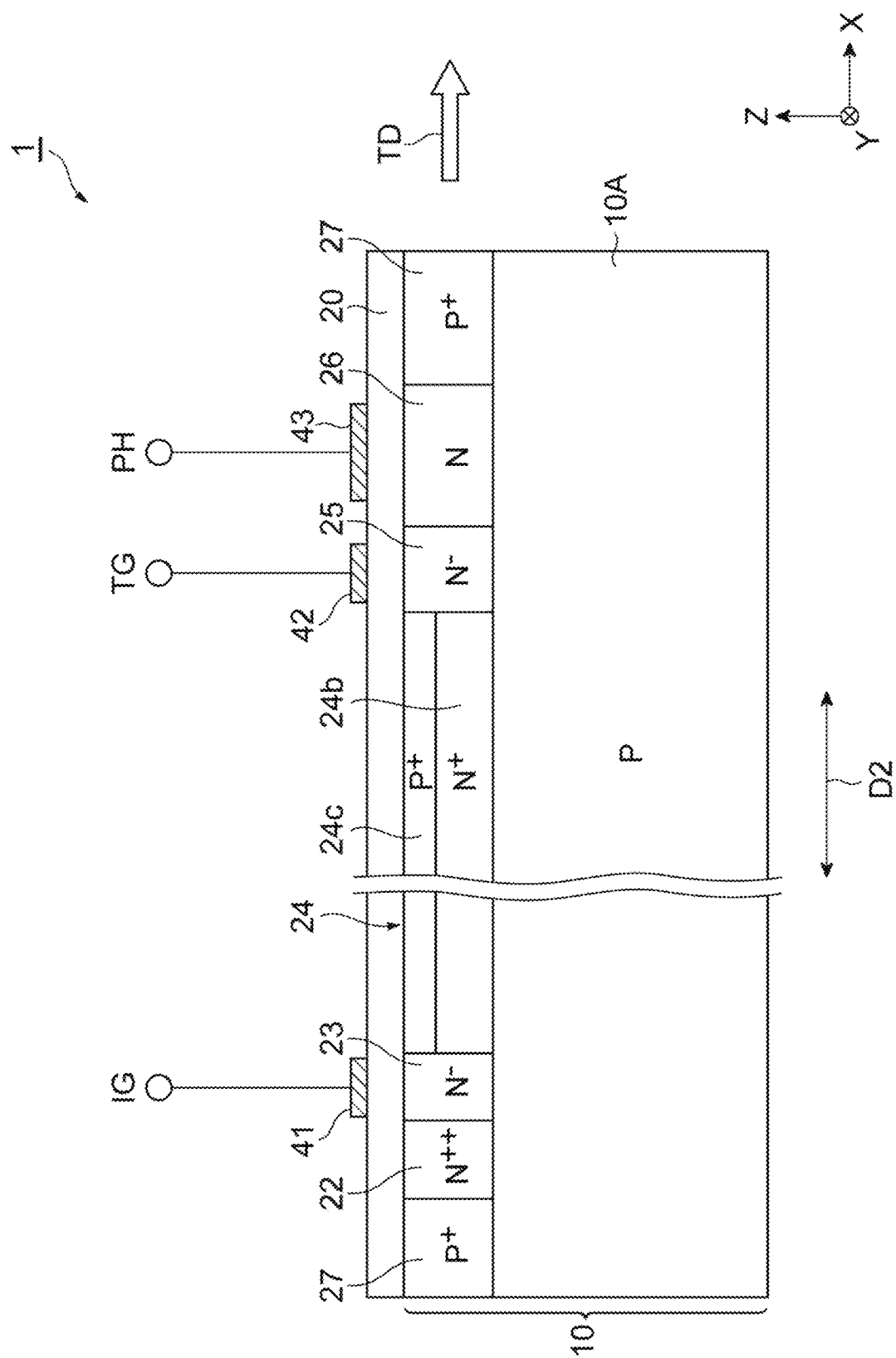
FIG. 2 is a view illustrating a cross-sectional configuration of the solid state imaging device.
Figure 3:
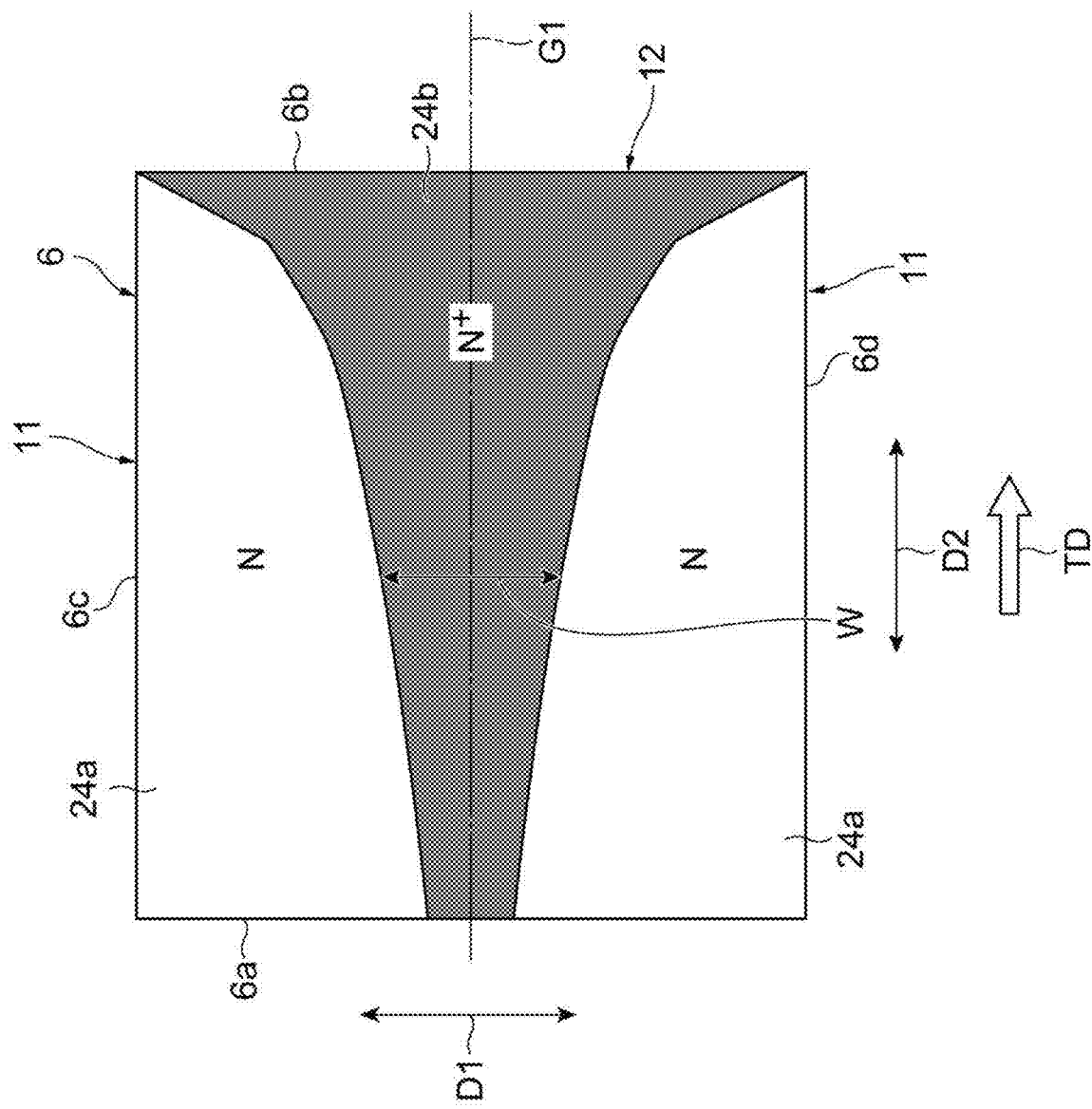
FIG. 3 is a schematic view illustrating a photosensitive region.
Figure 4:
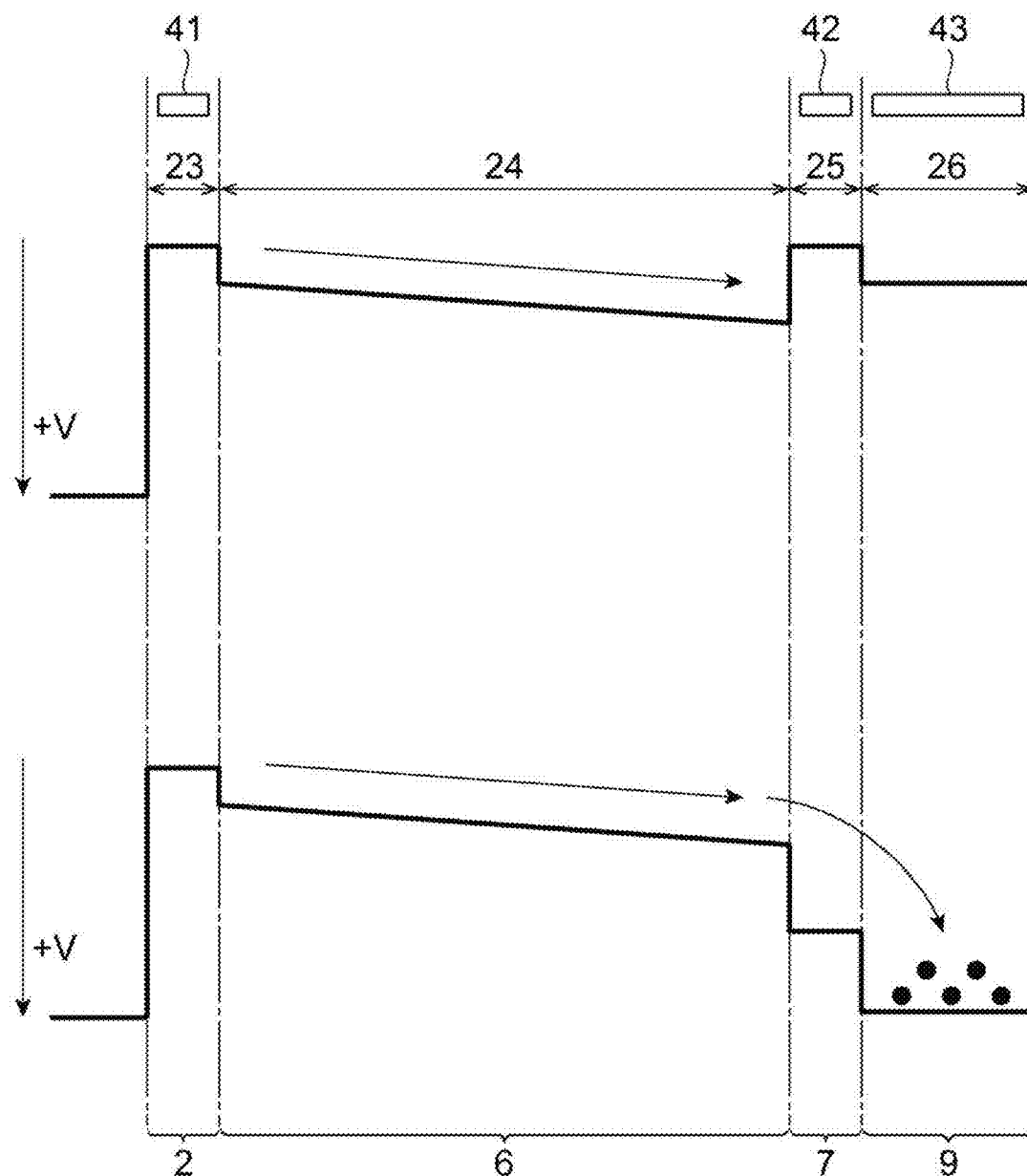
FIG. 4 is a view illustrating a change in electrical potential formed in the solid state imaging device.

First, a configuration of a solid state imaging device 1 according to the present embodiment will be described with reference to FIGS. 1 to 4. FIG. 1 is a view illustrating a planar configuration of the solid state imaging device. FIG. 2 is a view illustrating a cross-sectional configuration of the solid state imaging device. FIG. 2 illustrates the cross-sectional configuration of the solid state imaging device taken along line II-II in FIG. 1. FIG. 3 is a schematic view illustrating a photosensitive region. FIG. 4 is a view illustrating a change in electrical potential formed in the solid state imaging device.

As illustrated in FIG. 1, the solid state imaging device 1 includes a light receiving section 3, a plurality of input gate sections 4, a plurality of transfer sections 7, and a shift register 9. The shift register 9 is a charge output section. The solid state imaging device 1 is, for example, an implanted CCD linear image sensor.

The light receiving section 3 includes a plurality of photoelectric conversion sections 5. The plurality of photoelectric conversion sections 5 is distributed in a first direction D1. The photoelectric conversion section 5 is positioned between the input gate section 4 and the transfer section 7. The photoelectric conversion section 5 has a long rectangular shape in which a length in a second direction D2 is about 1 to 500 times a length in the first direction D1. In the present embodiment, the first direction D1 is a direction along an opposing direction of two long sides of the photoelectric conversion section 5. The first direction D1 includes both a positive direction and a negative direction along the Y axis. The second direction D2 is a direction along an opposing direction of two short sides of the photoelectric conversion section 5. The second direction D2 includes both a positive direction and a negative direction along the X axis. The second direction D2 intersects with the first direction D1. The first direction D1 and the second direction D2 are orthogonal to each other.

Each of the photoelectric conversion sections 5 includes one photosensitive region 6. The photosensitive region 6 generates a charge in response to incident light. The photosensitive region 6 has a rectangular shape defined by two long sides and two short sides in plan view. The plurality of photosensitive regions 6 is distributed in the first direction D1. The plurality of photosensitive regions 6 is disposed in an array in a one-dimensional direction with the first direction D1 as the one-dimensional direction. One photosensitive region 6 constitutes one pixel in the light receiving section 3.

The photosensitive region 6 includes a plurality of impurity regions having different impurity concentrations. As illustrated in FIG. 3, the photosensitive region 6 includes a pair of first impurity regions 11 and one second impurity region 12. The impurity concentration of the second impurity region 12 is higher than the impurity concentration of the first impurity region 11.

The photosensitive region 6 includes a pair of short sides 6a and 6b and a pair of long sides 6c and 6d. The photosensitive region 6 is defined by the pair of short sides 6a and 6b and the pair of long sides 6c and 6d. In the photosensitive region 6, the second impurity region 12 is provided from the short side 6a to the short side 6b in the second direction D2. In the present embodiment, the second impurity region 12 is continuously provided from the short side 6a to the short side 6b. The short side 6a is one end positioned away from the transfer section 7 in the second direction D2. The short side 6b is another end positioned closer to the transfer section 7 in the second direction D2. The second impurity region 12 includes one end and the other end. The second impurity region 12 is positioned between the pair of first impurity regions 11 in the first direction D1. The pair of short sides 6a and 6b oppose each other in the second direction D2. The second direction D2 is a direction in which the pair of short sides 6a and 6b oppose each other. The pair of long sides 6c and 6d oppose each other in the first direction D1. The first direction D1 is a direction in which the pair of long sides 6c and 6d oppose each other.

The second impurity region 12 has a shape that is line-symmetric with respect to a center line G1 of the photosensitive region 6 along the second direction D2 in plan view. A planar shape of the second impurity region 12 is line-symmetric with respect to the center line G1. The center line G1 is parallel to the pair of long sides 6c and 6d of the photosensitive region 6 and is positioned such that distances from the long sides 6c and 6d are equivalent. In the present embodiment, "equivalent" not only means that values are exactly the same, but also means that a difference in values is included in the range of a measurement error or a preset minute difference. The expression that the planar shape of the second impurity region 12 is line-symmetric with respect to the center line G1 represents that regions, obtained by dividing the second impurity region 12 by the center line G1 and positioned with the center line G1 therebetween, are mirror-symmetric and the regions has the same area and number. The center line G1 is a mirror symmetry axis.

A width W of the second impurity region 12 in the first direction D1 increases in the direction from the short side 6a toward the short side 6b. Hereinafter, the width W in the first direction D1 is referred to as the "width W". The width W increases monotonously in a narrow sense from the short side 6a toward the short side 6b. A detailed description of the shape of the second impurity region 12 will be described later with reference to FIG. 5.

The second impurity region 12 forms an electrical potential gradient that increases in the positive X-axis direction in FIG. 1 in the photosensitive region 6. The electrical potential gradient increases in the direction from the short side 6a toward the short side 6b. This electrical potential gradient allows transfer of the charge generated in the photosensitive region 6 in the direction from the short side 6a to the short side 6b in the photosensitive region 6. The charge that has reached the short side 6b is discharged from the photosensitive region 6. Hereinafter, the direction from the short side 6a to the short side 6b is referred to as a "transfer direction TD".

As illustrated in FIG. 1, one input gate section 4 corresponds to one photosensitive region 6 (one photoelectric conversion section 5). The input gate section 4 is disposed closer to the short side 6a of the corresponding photosensitive region 6. The input gate section 4 is distributed with the corresponding photosensitive region 6 (photoelectric conversion section 5) in the second direction D2 in such a manner as to be adjacent to the short side 6a of the corresponding photosensitive region 6. The input gate section 4 applies a predetermined electrical potential to a region of the photosensitive region 6 closer to the short side 6a.

One transfer section 7 corresponds to one photosensitive region 6 (one photoelectric conversion section 5). The transfer section 7 is disposed closer to the short side 6b of the corresponding photosensitive region 6. The transfer section 7 is distributed with the corresponding photosensitive region 6 (photoelectric conversion section 5) in the second direction D2 n such a manner as to be adjacent to the short side 6b of the corresponding photosensitive region 6. The transfer section 7 is positioned between the photosensitive region 6 and the shift register 9. The transfer section 7 acquires the charge discharged from the photosensitive region 6, and transfers the acquired charge to the shift register 9.

The shift register 9 is disposed such that each of the transfer sections 7 is positioned between each of the photosensitive regions 6 and the shift register 9. The shift register 9 is disposed closer to the short side 6b of the photosensitive region 6. The shift register 9 is adjacent to the plurality of transfer sections 7 in the second direction D2. The shift register 9 acquires the charge transferred from each of the transfer sections 7, transfers the charge in the negative Y-axis direction, and sequentially outputs the charge to an amplifier A. The amplifier A converts the charge output from the shift register 9 into a voltage, and outputs the converted voltage to the outside of the solid state imaging device 1 as an output of the photosensitive region 6.

Isolation regions are disposed between the adjacent photosensitive regions 6 and between the adjacent transfer sections 7. The isolation region disposed between the photosensitive regions 6 electrically isolates the adjacent photosensitive regions 6 from each other. The isolation region disposed between the transfer sections 7 electrically isolates the adjacent transfer sections 7.

The solid state imaging device 1 includes a semiconductor substrate 10. The light receiving section 3, the plurality of input gate sections 4, the plurality of transfer sections 7, and the shift register 9 are formed on the semiconductor substrate 10. In the present embodiment, the semiconductor substrate 10 is a silicon substrate. As illustrated in FIG. 2, the semiconductor substrate 10 includes a main part layer 10A serving as a base of the semiconductor substrate 10 and surface layers 22 to 27. The surface layers 22 to 27 are disposed on one side of the main part layer 10A.

The main part layer 10A is a p type semiconductor layer. The surface layer 22 is an $n^{++}$ type semiconductor layer. The surface layer 23 is an $n^-$ type semiconductor layer. As illustrated in FIG. 3, the surface layer 24 includes a pair of n type semiconductor layers 24a and one $n^+$ type semiconductor layer 24b. The surface layer 24 includes one $p^+$ type conductor layer 24c. The n type semiconductor layer 24a and the $n^+$ type semiconductor layer 24b are formed on the main part layer 10A. The $p^+$ type conductor layer 24c is formed on the n type semiconductor layer 24a and the $n^+$ type semiconductor layer 24b. As illustrated in FIG. 3, the $n^+$ type semiconductor layer 24b is positioned between the pair of n type semiconductor layers 24a in the first direction D1. The surface layer 25 is an $n^-$ type semiconductor layer. The surface layer 26 is an n type semiconductor layer. The surface layer 27 is a $p^+$ type semiconductor layer. The respective conductivity types of the p type and the n type may be switched so as to be opposite to the above-described conductivity types.

A high impurity concentration is indicated by "+" attached to a conductivity type. A low impurity concentration indicated by "−" attached to a conductivity type. The low impurity concentration also includes an aspect in which some impurities of a conductivity type attached with "−" are compensated with impurities of a conductivity type opposite to the conductivity type attached with "−" so that a low impurity concentration is obtained in appearance. The number of "+" indicates the degree of concentration of impurities of a conductivity type attached with "+", and the larger number of "+" means a higher concentration of impurities of the conductivity type attached with "+". The n type impurity is, for example, N, P, or As. The p type impurity is, for example, B or Al.

A pn junction is formed at an interface between the main part layer 10A, and the n type semiconductor layer 24a and the $n^+$ type semiconductor layer 24b. The n type semiconductor layer 24a and the $n^+$ type semiconductor layer 24b constitute the photosensitive region 6 that generates the charge with incident light. The n type semiconductor layer 24a constitutes the first impurity region 11 in the photosensitive region 6. A shape of the first impurity region 11 corresponds to a shape of the n type semiconductor layer 24a. The $n^+$ type semiconductor layer 24b constitutes the second impurity region 12. A shape of the second impurity region 12 corresponds to a shape of the $n^+$ type semiconductor layer 24b.

A concentration of n type impurities in the $n^+$ type semiconductor layer 24b is higher than a concentration of n type impurities in the n type semiconductor layer 24a. As illustrated in FIG. 3, the width W of the $n^+$ type semiconductor layer 24b gradually increases in the transfer direction TD. The width of the $n^+$ type semiconductor layer 24b is small in the region near the short side 6a in the transfer direction TD. In a case in which the width of the $n^+$ type semiconductor layer 24b is small, an influence of the fringing electric field from the n type semiconductor layer 24a positioned on both sides of the $n^+$ type semiconductor layer 24b is large. Therefore, a potential of the surface layer 24 is shallow in the region near the short side 6a in the transfer direction TD. The width of the $n^+$ type semiconductor layer 24b is large in the region near the short side 6b in the transfer direction TD. In a case in which the width of the $n^+$ type semiconductor layer 24b is large, the influence of the fringing electric field from the n type semiconductor layer 24a positioned on both sides of the $n^+$ type semiconductor layer 24b is small. Therefore, a potential of the surface layer 24 is deep in the region near the short side 6b in the transfer direction TD. Consequently, the surface layer 24 is formed with an inclination of a potential that gradually becomes deeper in the transfer direction TD as illustrated in FIG. 4. The surface layer 24 is formed with an electrical potential gradient that gradually increases in the transfer direction TD.

A plurality of electrodes 41, 42, and 43 is disposed on an insulating layer 20. The electrode 41 is formed on a region of the insulating layer 20 corresponding to the surface layer 23. The electrode 41 is disposed on the surface layer 23 such that the insulating layer 20 is positioned between the electrode 41 and the surface layer 23. The electrode 41 and the surface layer 23 constitute the input gate section 4. A drive circuit 101 gives a signal IG to the electrode 41. The electrical potential of the surface layer 23 is determined in response to the signal 1G. The electrical potential of the surface layer 23 is determined to be lower than the electrical potential of the surface layer 24. Therefore, the potential of the surface layer 23 is shallower than the potential of the surface layer 24, that is, the potential of the photosensitive region 6 as illustrated in FIG. 4. The drive circuit 101 is controlled by a control device 102.

The electrode 42 is formed on a region of the insulating layer 20 corresponding to the surface layer 25. The electrode 42 is disposed on the surface layer 25 such that the insulating layer 20 is positioned between the electrode 42 and the surface layer 25. The electrode 42 and the surface layer 25 constitute the transfer section 7. The drive circuit 101 gives a signal TG to the electrode 42. The electrical potential of the surface layer 25 changes in response to the signal TG. The potential of the surface layer 25 becomes shallower than the potential of the surface layer 24 as illustrated in (a) of FIG. 4 or becomes deeper than the potential of the surface layer 24 as illustrated in (b) of FIG. 4. Due to the change of the potential of the surface layer 25, the transfer section 7 acquires a charge from the photosensitive region 6, and sends the acquired charge to the shift register 9.

The electrode 43 is formed on a region of the insulating layer 20 corresponding to the surface layer 26. The electrode 43 is disposed on the surface layer 26 such that the insulating layer 20 is positioned between the electrode 43 and the surface layer 26. The electrode 43 and the surface layer 26 constitute the shift register 9. The drive circuit 101 gives a signal PH to the electrode 43. The electrical potential of the surface layer 26 changes in response to the signal PH. The potential of the surface layer 26 becomes shallower than the potential of the surface layer 24 and deeper than the potential of the surface layer 25 as illustrated in (a) of FIG. 4, or becomes deeper than the potential of the surface layer 24 and deeper than the potential of the surface layer 25 as illustrated in (b) of FIG. 4. The shift register 9 acquires a charge from the transfer section 7 based on the change of the potential of the surface layer 26. The shift register 9 sends the acquired charge to the amplifier A.

The surface layer 27 electrically isolates the surface layers 22 to 26 from other portions of the semiconductor substrate 10. The above-described isolation region can be formed by the surface layer 27. The electrodes 41 to 43 are, for example, polysilicon films. The insulating layer 20 is, for example, a silicon oxide film.

Figure 5:
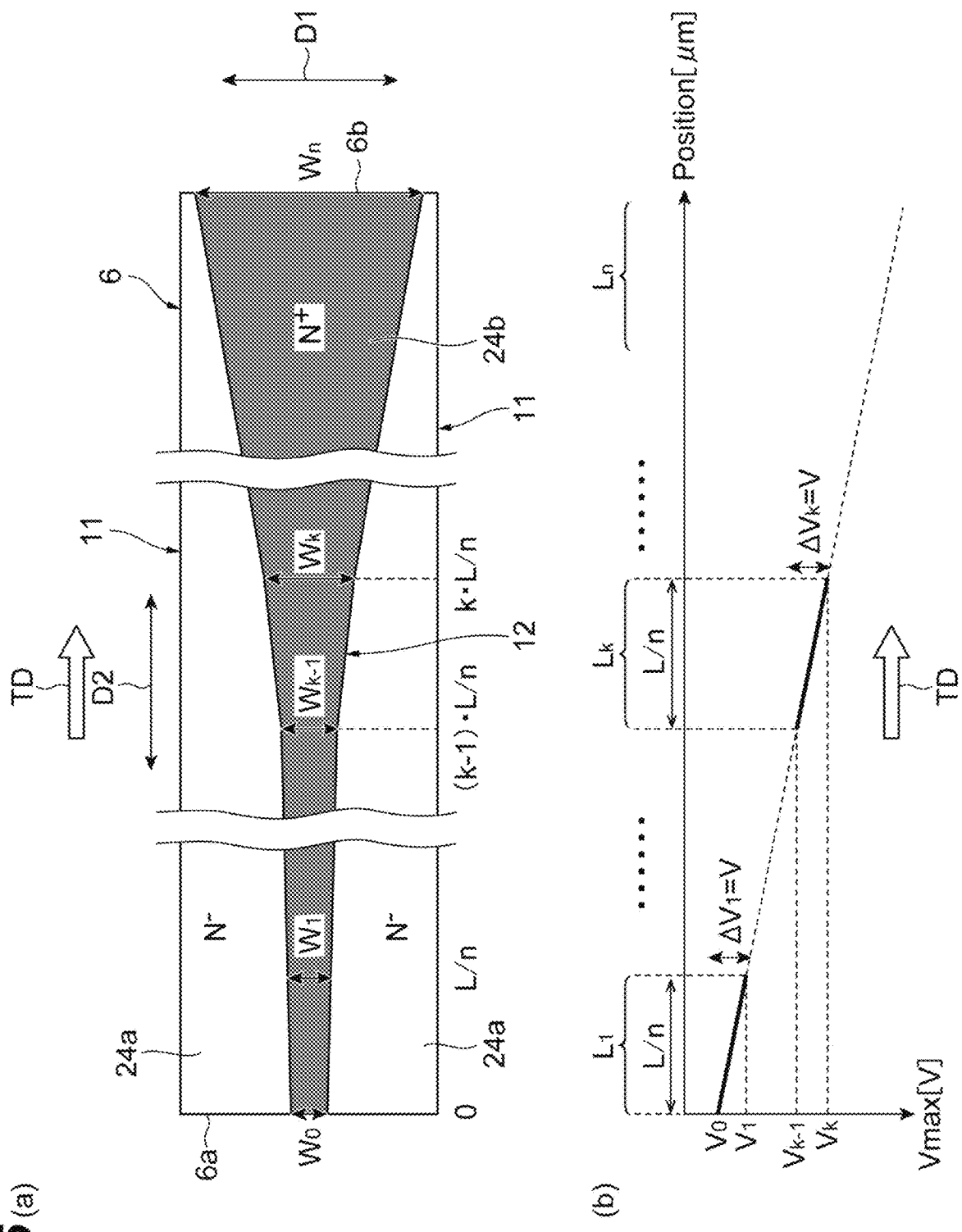
FIG. 5 is a view used for describing a width of a second impurity region.

Next, the shape of the second impurity region 12 will be described with reference to FIG. 5. FIG. 5 is a view used for describing the width of the second impurity region. Here, (a) of FIG. 5 is a schematic view illustrating the photosensitive region. In (a) of FIG. 5, the photosensitive region 6 having a length L in the second direction D2 is divided into n sections in the second direction D2. Here, n is an integer of two or more. Here, (a) of FIG. 5 illustrates widths $W_0, \ldots, W_k, \ldots,$ and $W_n$ of the second impurity region 12 in sections $L_1, \ldots, L_k, \ldots,$ and $L_n$ obtained by dividing the photosensitive region 6 into n sections. Here, k is an integer of two or more and n−1 or less. Each of the widths $W_1, \ldots, W_k, \ldots,$ and $W_n$ of the second impurity region 12 is, for example, a width at a position closest to the short side 6b in each of the sections $L_1, L_k, \ldots,$ and $L_n$. In this case, the widths $W_1, \ldots, W_k, \ldots,$ and $W_n$ are the maximum widths in the respective sections $L_1, \ldots, L_k, \ldots,$ and $L_n$. The width $W_0$ is the minimum width in the section L1. The width $W_0$ is the width of the second impurity region 12 at the most upstream end (short side 6a) in the transfer direction TD in the photosensitive region 6. The widths $W_1, \ldots, W_k, \ldots,$ and $W_n$ are not limited to the maximum widths in the respective sections $L_1, \ldots, L_k, \ldots,$ and $L_n$. For example, each of the widths $W_1, \ldots, W_k, \ldots,$ and $W_n$ may be an average value of widths in each of the sections $L_1, \ldots, L_k, \ldots,$ and $L_n$. Further, (b) of FIG. 5 is a graph illustrating the electrical potential gradient of the photosensitive region 6 in each of the sections $L_1, \ldots, L_k, \ldots,$ and $L_n$. The horizontal axis in (b) of FIG. 5 indicates a position [μm] along the transfer direction TD in the photosensitive region 6. The vertical axis in (b) of FIG. 5 indicates the maximum electrical potential [V] at each position.

In the present embodiment, each of the sections $L_1, \ldots, L_k, \ldots,$ and $L_n$ is each of sections obtained by equally dividing the photosensitive region 6 into n sections in the second direction D2. Although the equal division means division into equal amounts, each of the sections $L_1, \ldots, L_k, \ldots,$ and $L_n$ is not necessarily divided to have the completely equal amount. For example, the width of each of the sections $L_1, \ldots, L_k, \ldots,$ and $L_n$ in the second direction D2 may include a measurement error or a minute difference within a preset range of ±several μm. As illustrated in (a) of FIG. 5, increase rates $\Delta W_1, \ldots, \Delta W_k, \ldots,$ and $\Delta W_n$ of the widths $W_1, \ldots, W_k, \ldots,$ and $W_n$ of the second impurity region 12 ($\Delta W_k = W_k - W_{k-1}$) gradually increase in the transfer direction TD. Within each of the sections $L_1, \ldots, L_k, \ldots,$ and $L_n$, the width W of the second impurity region 12 gradually increases from the upstream side to the downstream side in the transfer direction TD. Within each of the sections $L_1, \ldots, L_k, \ldots,$ and $L_n$, the width W of the second impurity region 12 monotonously increases in the transfer direction TD from the upstream end to the downstream end in the transfer direction TD. As illustrated in (b) of FIG. 5, the widths $W_1, \ldots, W_k, \ldots,$ and $W_n$ of the second impurity regions 12 are set such that each of electrical potential differences $\Delta V_1, \ldots, \Delta V_k, \ldots,$ and $\Delta V_n$ ($\Delta V_k = V_k - V_{k-1}$) between adjacent sections among the sections $L_1, \ldots, L_k, \ldots,$ and $L_n$. becomes constant; provided, however, that $\Delta V_1 = V_1 - V_0$. Here, $V_0$ is an electrical potential of the photosensitive region 6 at the position of the width $W_0$.

Next, a process of determining the shape of the second impurity region 12 will be described.

Figure 6:
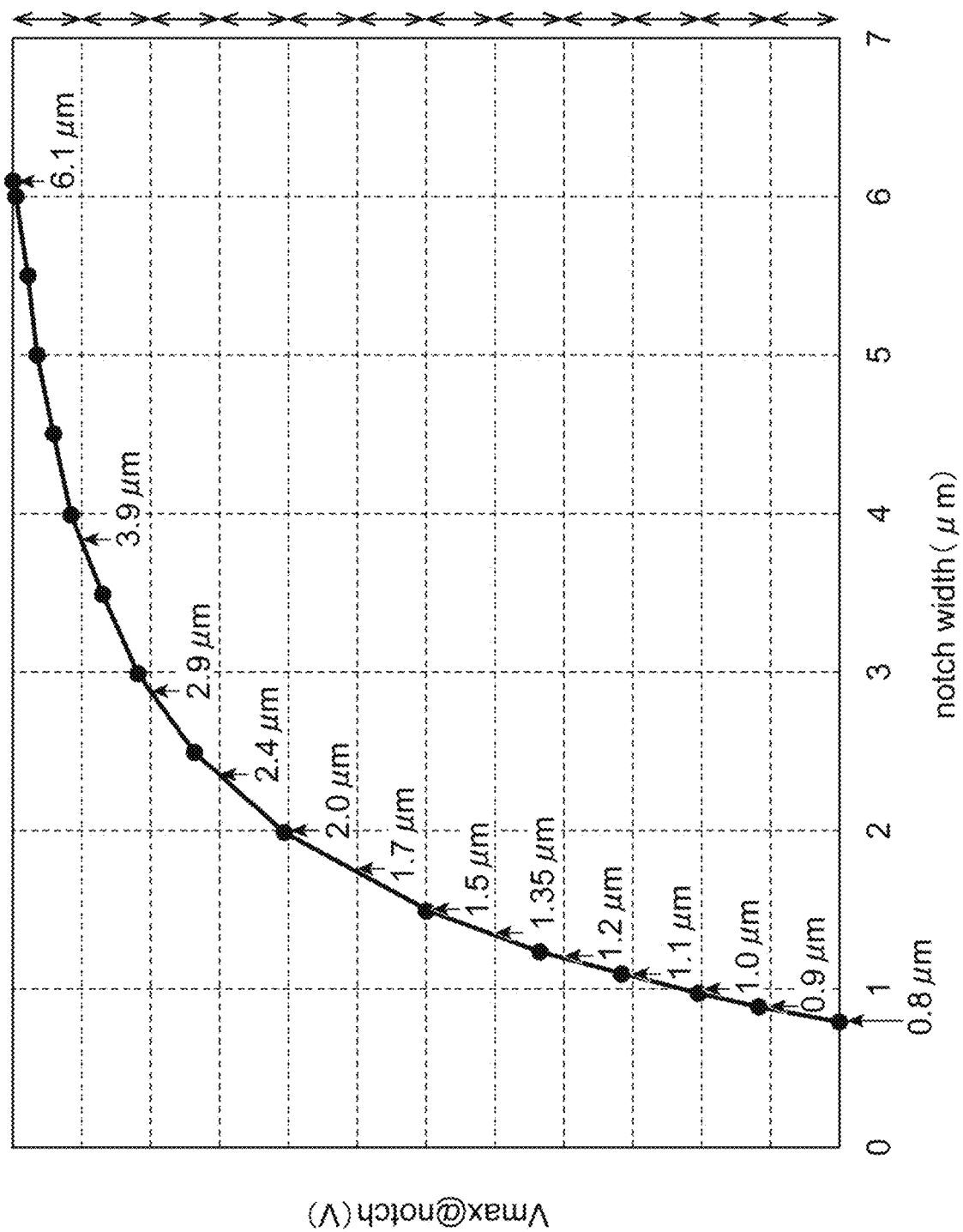
FIG. 6 is a graph illustrating an electrical potential of the photosensitive region for each notch width.

First, procedures for obtaining the widths $W_1, \ldots, W_k, \ldots,$ and $W_n$ of the second impurity region 12 will be described. In a first procedure, an electrical potential of the photosensitive region 6 for each predetermined notch width is calculated. At this electrical potential calculation, a model of a solid state imaging device including the second impurity region 12 with a constant notch width in the transfer direction TD is used. The maximum electrical potential of the photosensitive region 6 is calculated for each predetermined notch width. The notch width is, for example, a value within the range of 0.8 μm to 6.1 μm. Calculation results are illustrated in FIG. 6. FIG. 6 is a graph illustrating the electrical potential of the photosensitive region for each notch width. The horizontal axis in FIG. 6 indicates the notch width [μm]. The vertical axis in FIG. 6 indicates the maximum electrical potential [V] of the photosensitive region 6 corresponding to the notch width. The vertical axis in FIG. 6 indicates that the maximum electrical potential increases in the upward direction, and the maximum electrical potential decreases in the downward direction.

In a second procedure, the electrical potential in the range corresponding to the range where the notch width is 0.8 μm to 6.1 μm is equally divided into n sections in the graph of FIG. 6. In the example illustrated in FIG. 6, for example, the electrical potential is equally divided into twelve sections. The notch widths at the respective equally dividing points $(1, \ldots, k, \ldots$ and n) of the electrical potential are read from the graph of FIG. 6. The read notch widths at the respective equally dividing points are defined as the respective widths $W_1, \ldots, W_k, \ldots,$ and $W_n$ of the second impurity region 12 corresponding to the respective equally dividing points. In the example illustrated in FIG. 6, the width $W_1$ is 0.9 μm, the width $W_2$ is 1.0 μm, the width $W_3$ is 1.1 μm, the width $W_4$ is 1.2 μm, the width $W_5$ is 1.35 μm, and the width $W_6$ is 1.5 μm. The width $W_7$ is 1.7 μm, the width $W_8$ is 2.0 μm, the width $W_9$ is 2.4 μm, the width $W_{10}$ is 2.9 μm, the width $W_{11}$ is 3.9 μm, and the width $W_{12}$ is 6.1 μm.

With the above procedure, the widths $W_1, \ldots, W_k, \ldots,$ and $W_n$ of the second impurity region 12 in which the electrical potential difference in the photosensitive region 6 between adjacent sections is constant are obtained. The width $W_0$ is set to the minimum value of the notch width. In the example illustrated in FIG. 6, the width $W_0$ is 0.8 μm.

Figure 7:
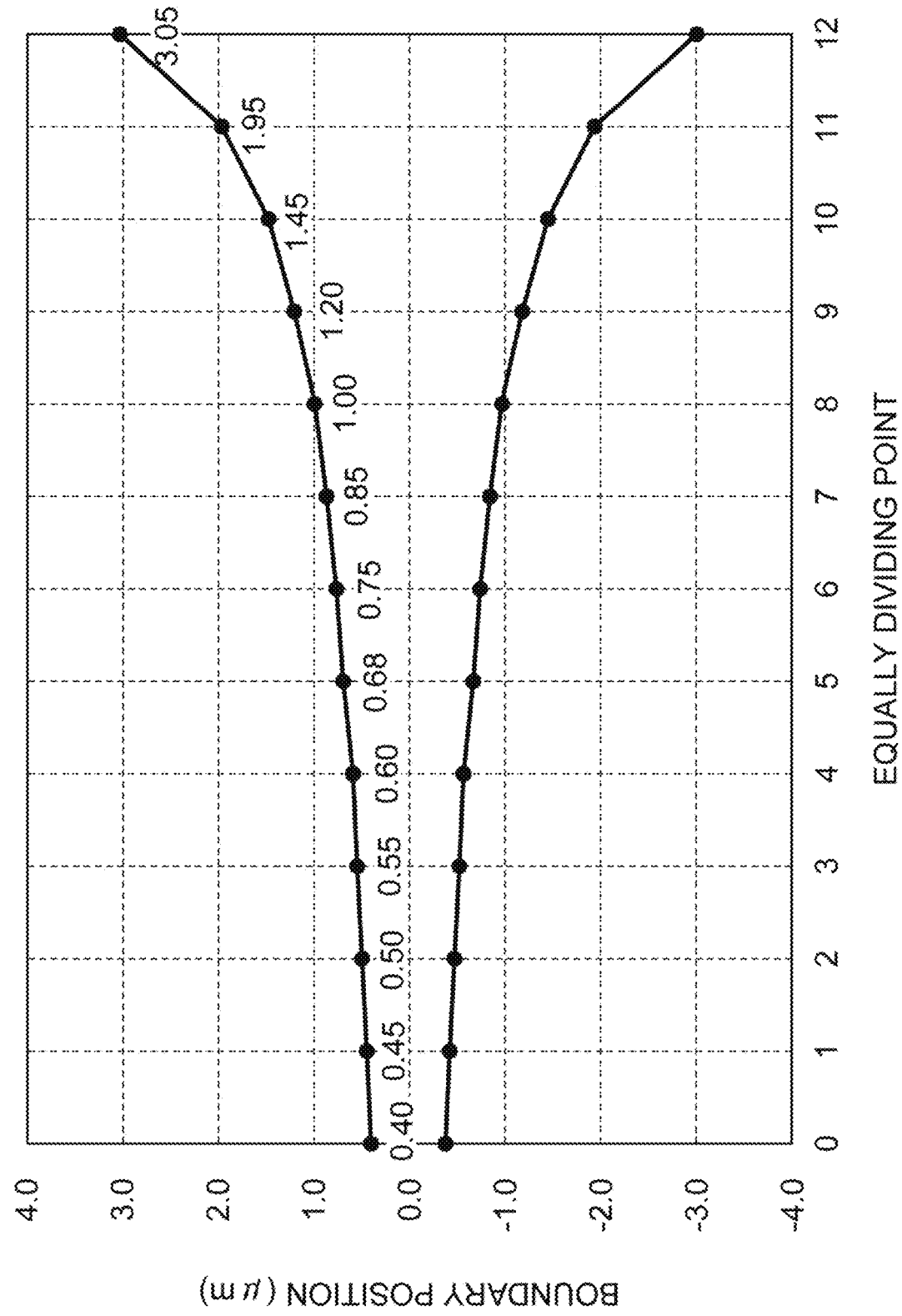
FIG. 7 is a graph illustrating a width of the second impurity region at each equally dividing point.

Next, the shape of the second impurity region 12 is determined based on the obtained widths $W_0, W_1, \ldots, W_k, \ldots,$ and $W_n$. As illustrated in the graph of FIG. 7, the respective widths $W_0, W_1, \ldots, W_k, \ldots,$ and $W_n$ of the second impurity region 12 are plotted so as to correspond to the respective equally dividing points of $n = 0, 1, \ldots,$ k, ..., and n. FIG. 7 is a graph illustrating a width of the second impurity region at each equally dividing point. FIG. 7 is a graph illustrating the widths $W_0, W_1, \ldots, W_k, \ldots,$ and $W_n$ of the second impurity region 12 corresponding to the respective equally dividing points. The horizontal axis in FIG. 7 indicates the equally dividing points of $n = 0, 1, \ldots,$ k, ..., and n. The vertical axis in FIG. 7 indicates a position [μm] with respect to the center of each of the widths $W_0, W_1, \ldots, W_k, \ldots,$ and $W_n$. The vertical axis in FIG. 7 is also a boundary position between the second impurity region 12 and the first impurity region 11.

The shape of the second impurity region 12 is determined by the above procedure. The shape of the second impurity region 12 is a shape similar to the shape illustrated in the graph of FIG. 7 regardless of the length of the photoelectric conversion section 5 in the transfer direction TD.

Figure 8:
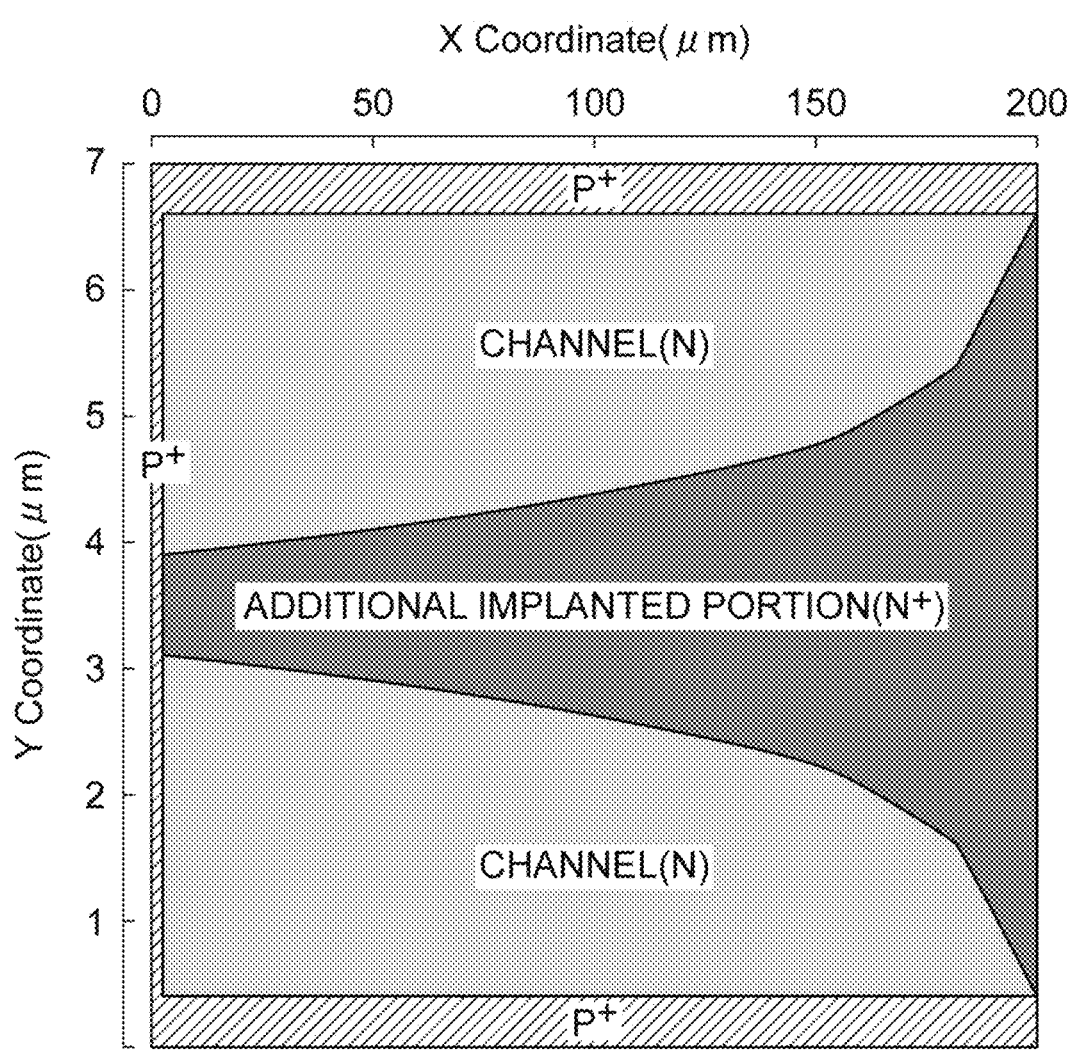
FIG. 8 is a view illustrating a simulation model of the photosensitive region including the second impurity region in the present embodiment.
Figure 9:
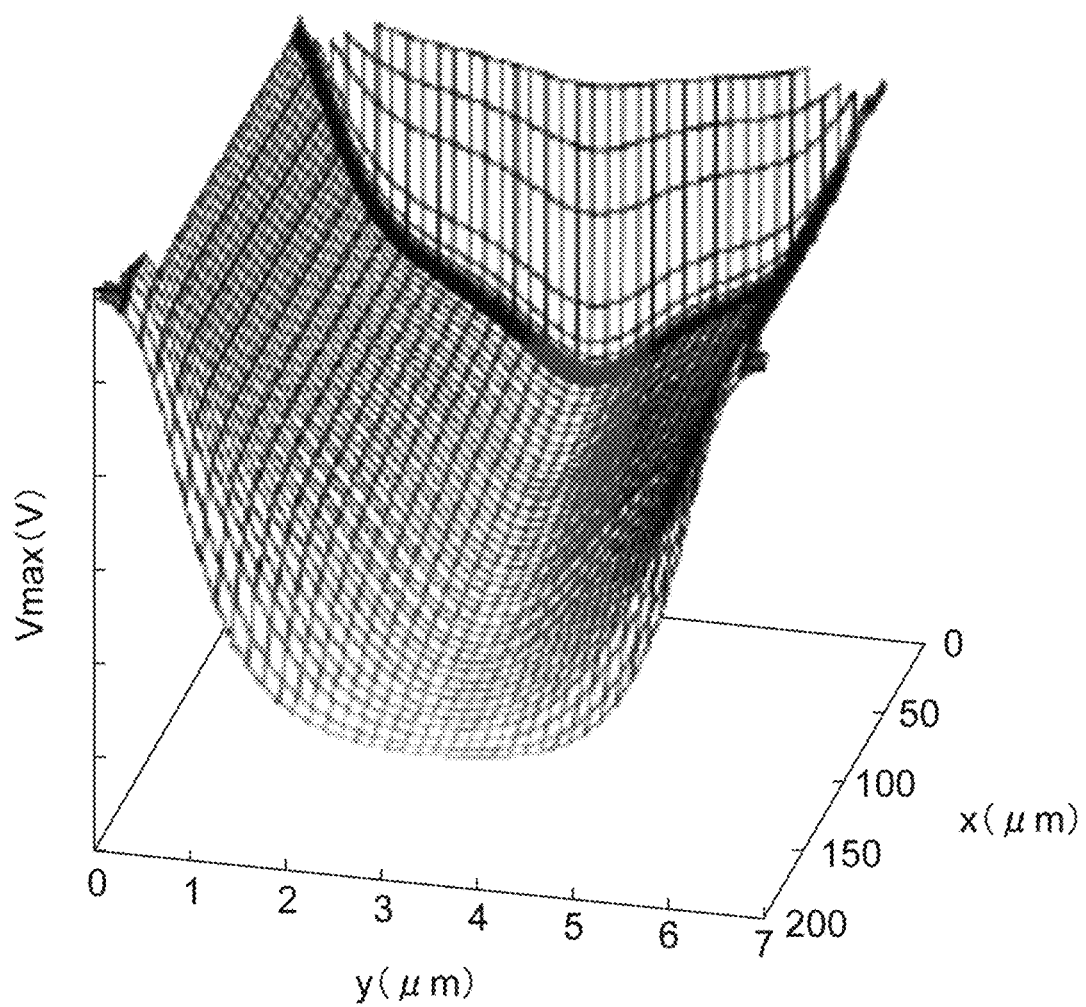
FIG. 9 is a graph illustrating a potential of the photosensitive region in a three-dimensional space.
Figure 10:
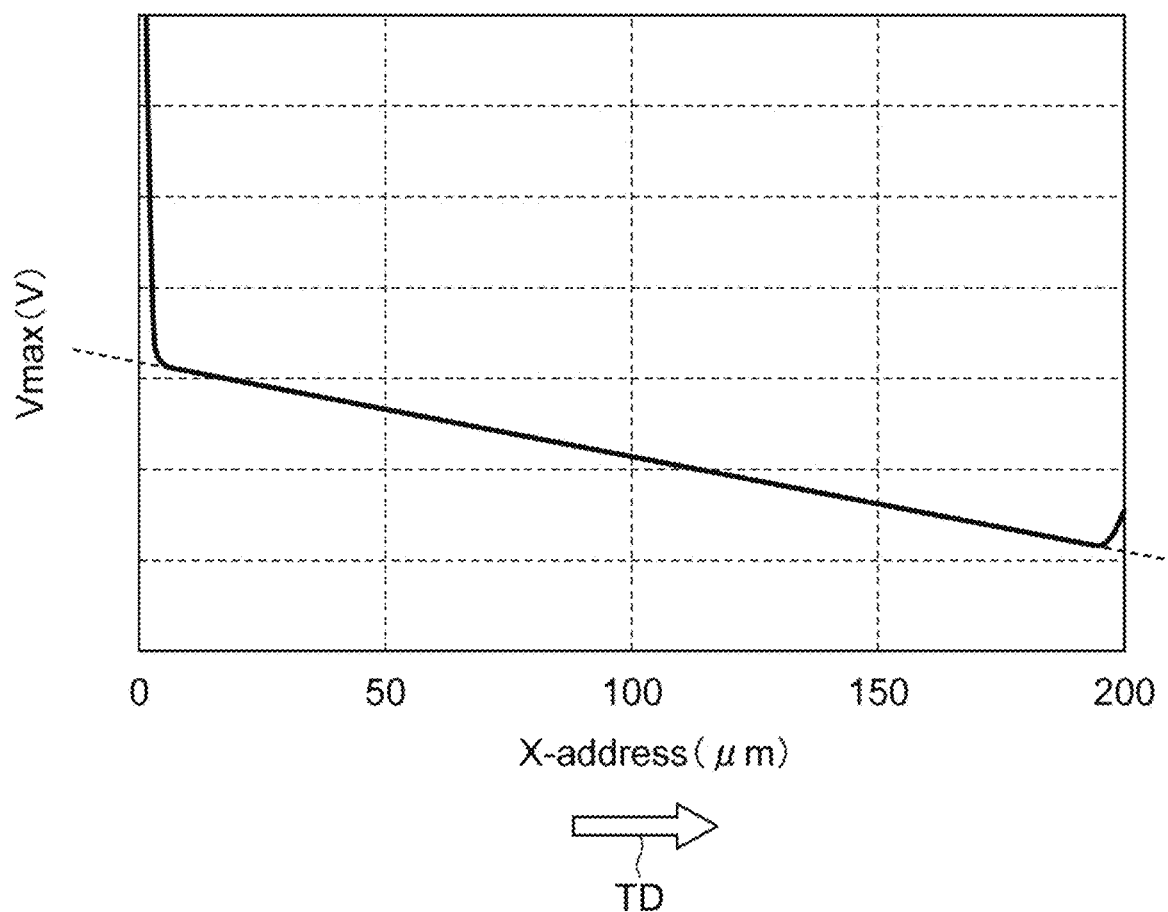
FIG. 10 is a graph illustrating an electrical potential gradient in a transfer direction.

Next, a simulation was performed to illustrate that the shape of the second impurity region 12 is suitable for improvement of charge transfer efficiency. Simulation results are illustrated in FIGS. 8 to 10. FIG. 8 is a view illustrating a simulation model of the photosensitive region including the second impurity region in the present embodiment. FIG. 9 is a graph illustrating a potential of the photosensitive region in a three-dimensional space. The potential illustrated in FIG. 9 is a simulation result of the potential of the photosensitive region 6 using the model illustrated in FIG. 8. In FIG. 9, the positive x-axis direction corresponds to the transfer direction TD. In FIG. 9, the y-axis direction corresponds to a width direction of the second impurity region 12. The vertical axis in FIG. 9 indicates the maximum electrical potential. The vertical axis in FIG. 9 indicates that the maximum electrical potential decreases in the upward direction, and the maximum electrical potential increases in the downward direction. The vertical axis in FIG. 9 indicates that the potential is shallower in the upward direction and the potential is deeper in the downward direction. FIG. 10 is a graph illustrating an electrical potential gradient in the transfer direction. FIG. 10 is a graph obtained by plotting a value of the electrical potential corresponding to a position of the photosensitive region 6 in the transfer direction TD based on the simulation result illustrated in FIG. 9. The horizontal axis of FIG. 10 indicates the position [μm] of the photosensitive region 6 in the transfer direction TD. In FIG. 10, the positive x-axis direction is the transfer direction TD. The vertical axis in FIG. 10 indicates the maximum electrical potential [V] of the photosensitive region 6 at each position. The vertical axis in FIG. 10 indicates that the maximum electrical potential decreases in the upward direction, and the maximum electrical potential increases in the downward direction.

As illustrated in FIG. 10, the electrical potential gradient in the photosensitive region 6 is approximately constant over approximately the entire region along the transfer direction TD of the photosensitive region 6. The charge generated in the photosensitive region 6 is transferred along the electrical potential gradient having an approximately constant slope. Therefore, the charge generated in the photosensitive region 6 is transferred efficiently.

Next, it is illustrated with reference to FIGS. 11 and 12 that the shape of the second impurity region 12 of the present embodiment is suitable for improvement of charge transfer efficiency as compared with reference examples. FIG. 11 is a schematic view illustrating second impurity regions in the reference examples. In a reference example illustrated in (a) of FIG. 11, an increase rate of a width W of a second impurity region 50A is constant from a short side 6a to a terminal region EA near a short side 6b. The increase rate of the width W in the terminal region EA is larger than the increase rate of the width W from the short side 6a to the terminal region EA. In a reference example illustrated in (b) of FIG. 11, an increase rate of a width W of a second impurity region 50B is constant from a short side 6a to a short side 6b.

Figure 12:
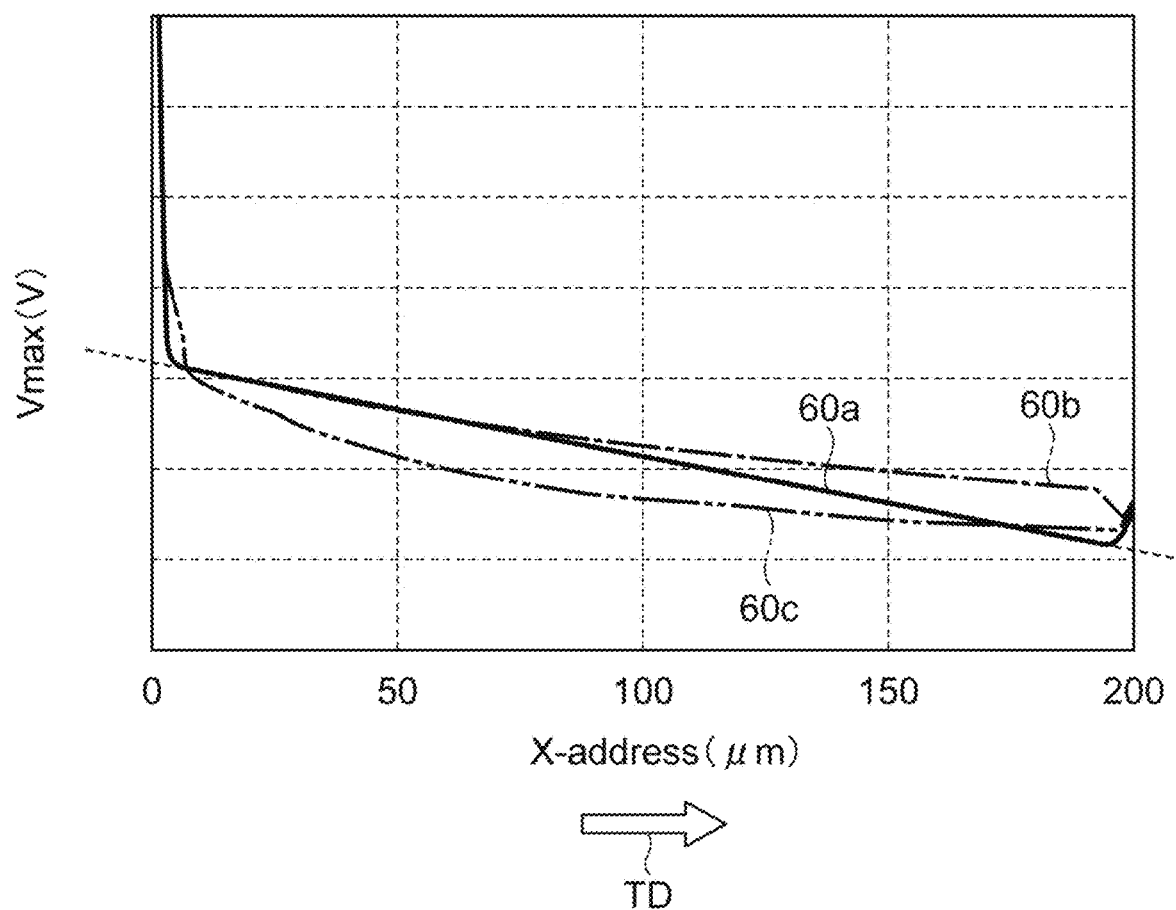
FIG. 12 is a graph of the electrical potential gradient in the photosensitive region compared between the present embodiment and the reference examples.

FIG. 12 is a graph of the electrical potential gradient in the photosensitive region compared between the present embodiment and the reference examples. A characteristic 60a in FIG. 12 illustrates an electrical potential gradient in the photosensitive region 6 including the second impurity region 12 of the above-described embodiment, and corresponds to a characteristic illustrated in FIG. 10. A characteristic 60b in FIG. 12 indicates an electrical potential gradient in the photosensitive region 6 including the second impurity region 50A. The characteristic 60b indicates the electrical potential gradient obtained from simulation results of the potential of the photosensitive region 6 using a simulation model of the photosensitive region 6 including the second impurity region 50A. A characteristic 60c in FIG. 12 indicates an electrical potential gradient in the photosensitive region 6 including the second impurity region 50B. The characteristic 60c indicates the electrical potential gradient obtained from simulation results of the potential of the photosensitive region 6 using a simulation model of the photosensitive region 6 including the second impurity region 50B.

In a case in which the photosensitive region 6 includes the second impurity region 50A or the second impurity region 50B as illustrated in FIG. 12, the electrical potential gradient decreases from the center to a terminal end of the photosensitive region 6 in the transfer direction TD. Specifically, a portion where the electrical potential gradient decreases is generated at a position of 100 μm to 200 μm. In contrast, in a case in which the photosensitive region 6 includes the second impurity region 12 of the above-described embodiment, the electrical potential gradient is approximately constant without generating a portion where the electrical potential gradient decreases. In the present embodiment, the photosensitive region 6 tends not to generate the portion where the electrical potential gradient decreases, and efficiently transfers the charge, as compared with the reference examples. From the above, it is understood that the shape of the second impurity region 12 of the present embodiment is suitable for improvement of the charge transfer efficiency.

Figure 13:
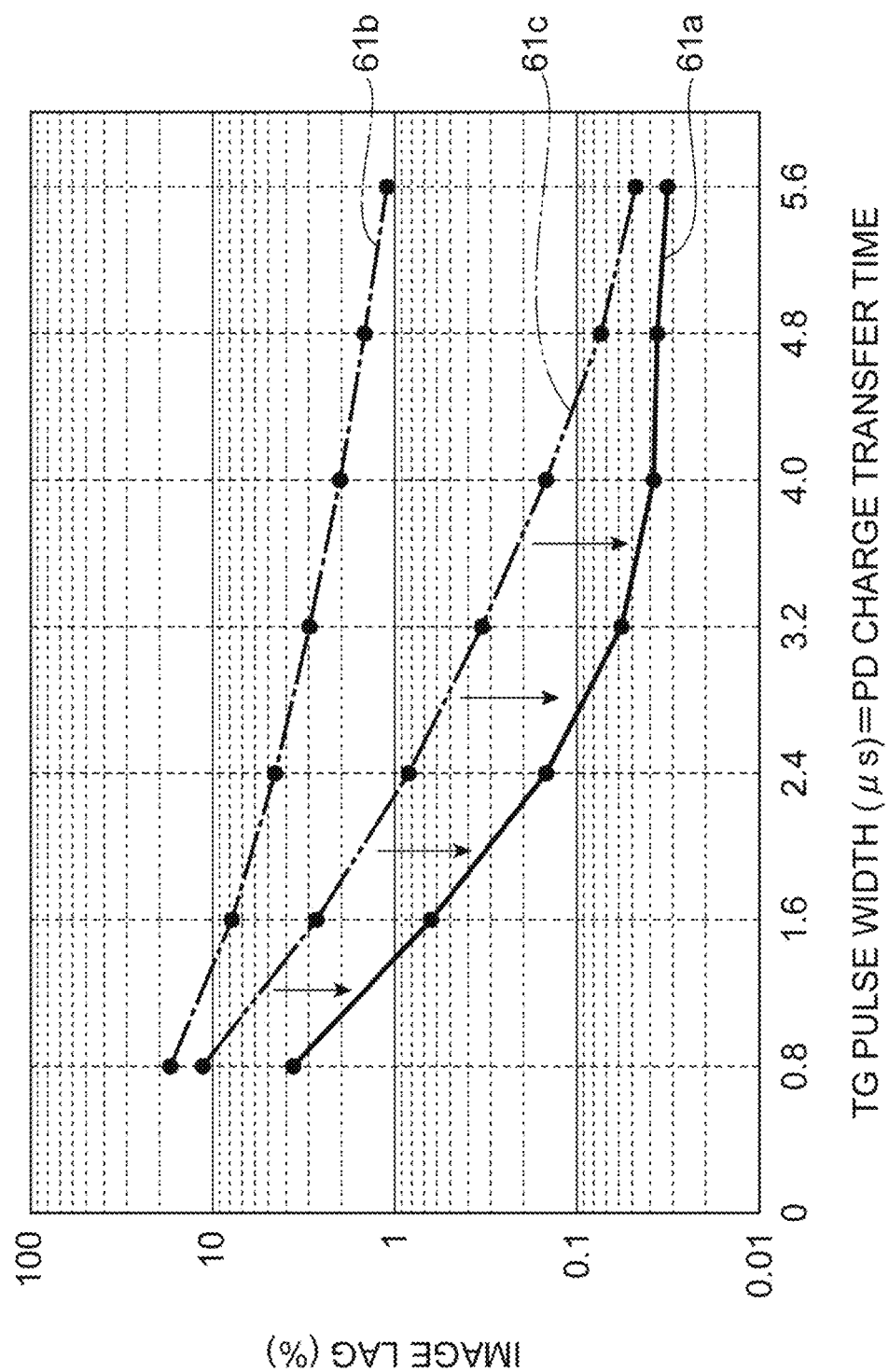
FIG. 13 is a graph of an actually measured value of an image lag corresponding to transfer time compared between the present embodiment and the reference examples.

FIG. 13 is a graph of an actually measured value of an image lag corresponding to transfer time compared between the present embodiment and the reference examples. The horizontal axis in FIG. 13 represents charge transfer time [μs] in the photosensitive region 6. The vertical axis in FIG. 13 represents an image lag [%]. The image lag is an afterimage that is generated when a charge remains in the photosensitive region 6 since the charge is not completely transferred from the photosensitive region 6. In FIG. 13, each of characteristics 61a, 61b, 61c indicates an actual measurement result of the image lag. The characteristic 61a indicates the actual measurement result of the image lag in the configuration in which the photosensitive region 6 includes the second impurity region 12. The characteristic 61b illustrates the actual measurement result of the image lag in the configuration in which the photosensitive region 6 includes the second impurity region 50A. The characteristic 61c illustrates the actual measurement result of the image lag in the configuration in which the photosensitive region 6 includes the second impurity region 50B.

As illustrated in FIG. 13, the image lag is greatly reduced in the photosensitive region 6 including the second impurity region 12 of the present embodiment as compared with the photosensitive region 6 including the second impurity region 50A or 50B. Therefore, the actually measured values also indicate that the present embodiment improves the charge transfer efficiency of the photosensitive region 6 as compared with the reference examples.

As described above, the width W of the second impurity region 12 increases in the transfer direction TD in the present embodiment. Therefore, the photosensitive region 6 is formed with the electrical potential gradient in which the electrical potential increases from the short side 6a toward the short side 6b. The second impurity region 12 has the shape that is line-symmetric with respect to the center line G1 of the photosensitive region 6 in plan view. Therefore, charges are transferred with the same efficiency in the photosensitive region 6 regardless of positions where the charges are generated. The increase rate $\Delta W_1, \ldots, \Delta W_k, \ldots,$ and $\Delta W_n$ of the widths $W_1, \ldots, W_k, \ldots,$ and $W_n$ of the second impurity region 12 in the respective sections $L_1, \ldots, L_k, \ldots,$ and $L_n$, obtained by dividing the photosensitive region 6 into n sections in the second direction D2, gradually increase in the transfer direction TD. In this case, a shape of the second impurity region 12 is a shape in which a portion having a small electrical potential gradient tends not to be generated in the photosensitive region 6. Each of the photoelectric conversion sections 5 efficiently transfers the charge. Therefore, the solid state imaging device 1 improves charge transfer efficiency.

In the present embodiment, the widths $W_1, \ldots, W_k, \ldots,$ and $W_n$ of the second impurity region 12 in the respective sections $L_1, \ldots, L_k, \ldots,$ and $L_n$ are set such that the electrical potential difference of the photosensitive region 6 between the adjacent sections among the sections $L_1, \ldots, L_k, \ldots,$ and $L_n$ is constant. In this case, the electrical potential gradient in the photosensitive region 6 is approximately constant. Therefore, each of the photoelectric conversion sections 5 transfers the charge more efficiently. In a case in which the photoelectric conversion section 5 has a long shape and a transfer distance in the photosensitive region 6 becomes long, it is advantageous that the electrical potential gradient in the photosensitive region 6 is approximately constant.

Although the embodiment of the present invention has been described as above, the present invention is not necessarily limited to the above-described embodiment, and various modifications can be made in a range without departing from a gist thereof.

Figure 14:
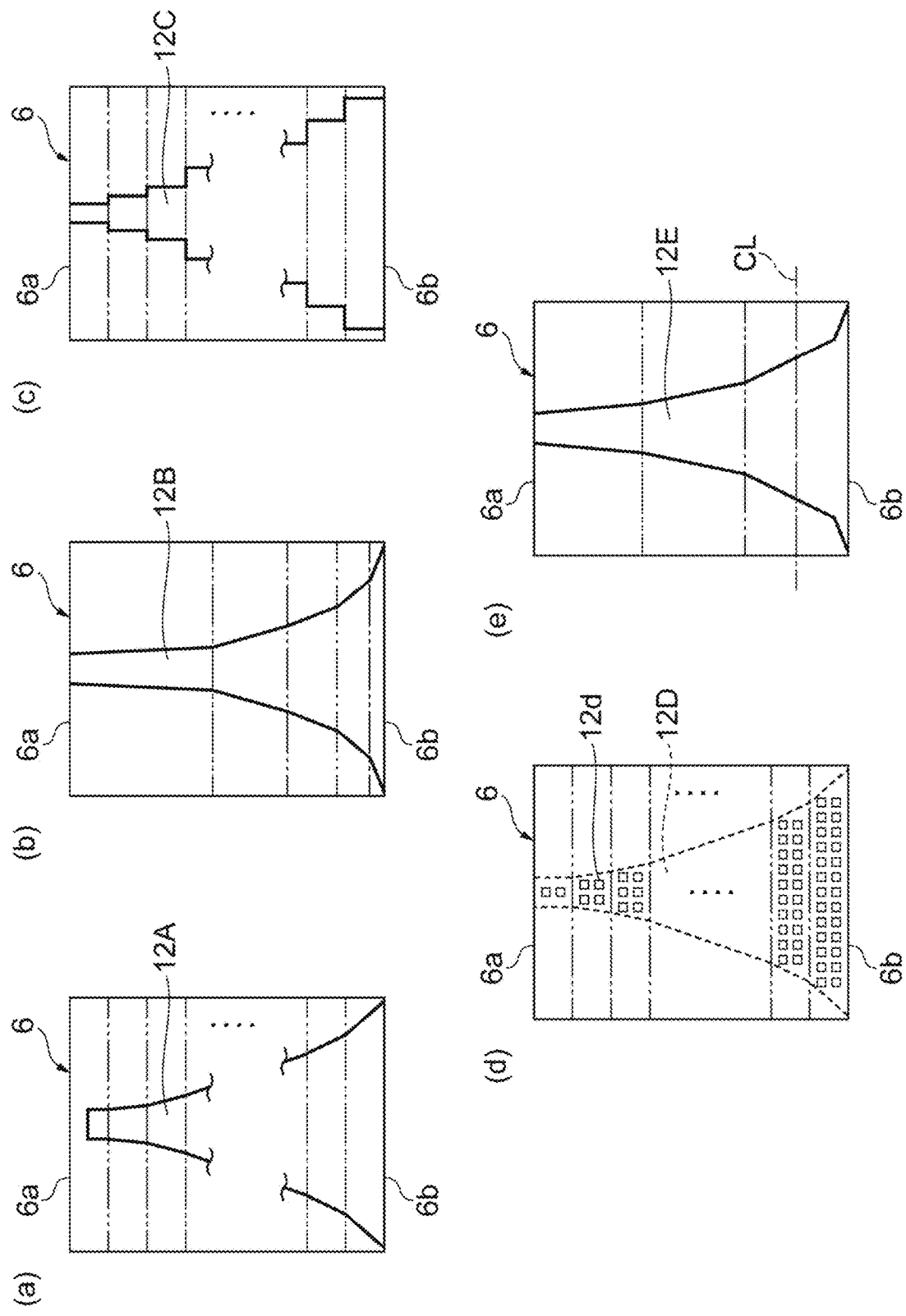
FIG. 14 is a schematic view illustrating modifications of the second impurity region.

For example, the shape of the second impurity region 12 is not limited to the shape illustrated in the above embodiment. The second impurity region 12 can have various shapes as illustrated in FIG. 14. FIG. 14 illustrates a plurality of second impurity regions 12A to 12E, which are modifications of the second impurity region 12. FIG. 14 is a schematic view illustrating the modifications of the second impurity region. In FIG. 14, a boundary position of each of sections obtained by dividing the photosensitive region 6 into a plurality of sections is indicated by a two-dot chain line.

In the above embodiment, the second impurity region 12 is provided from the short side 6a to the short side 6b in the photosensitive region 6. The second impurity region 12 is not necessarily provided from the short side 6a in the photosensitive region 6. For example, as illustrated in (a) of FIG. 14, the second impurity region 12A is provided from a vicinity of the short side 6a to the short side 6b. The vicinity of the short side 6a means, for example, a position away from the short side 6a to such an extent that movement of a charge is not hindered. In this case, the vicinity of the short side 6a is a position separated by about several μm from the short side 6a. In (a) of FIG. 14, the vicinity of the short side 6a is a position closer to the short side 6b than the short side 6a in the section $L_1$, which is the closest to the short side 6a among the sections $L_1, \ldots, L_k, \ldots,$ and $L_n$.

In the above embodiment, each of the sections $L_1, \ldots, L_k, \ldots,$ and $L_n$ is each of the sections obtained by equally dividing the photosensitive region 6 into n sections, and the widths of the respective sections $L_1, \ldots, L_k, \ldots,$ and $L_n$ in the second direction D2 are equivalent. The widths of the respective sections $L_1, \ldots, L_k, \ldots,$ and $L_n$ in the second direction D2 are not necessarily equivalent. As illustrated in (b) of FIG. 14, each of the sections is, for example, each of sections obtained by dividing the photosensitive region 6 such that a width in the second direction D2 becomes gradually narrower in the transfer direction TD. Even in this case, an increase rate of a width of a second impurity region 12B in each of the sections becomes gradually larger in the transfer direction TD.

In the above embodiment, the width W of the second impurity region 12 increases within each of the sections $L_1, \ldots, L_k, \ldots,$ and $L_n$. The width W of the second impurity region 12 does not necessarily increase within each of the sections $L_1, \ldots, L_k, \ldots,$ and $L_n$. For example, as illustrated in (c) of FIG. 14, a width W of a second impurity region 12C does not increase within each section, but increases at a boundary position of each of the sections. An outer shape of the second impurity region 12C within each of the sections is a rectangle.

In the above embodiment, the second impurity region 12 is constituted by one region. The second impurity region 12 may be constituted by a plurality of minute regions. For example, as illustrated in (d) of FIG. 14, the second impurity region 12D is constituted by a plurality of minute regions 12d in each section. In (d) of FIG. 14, an outline of a region corresponding to the second impurity region 12D is indicated by a broken line.

In the section $L_n$, which is the closest to the short side 6b among the sections $L_1, \ldots, L_k, \ldots,$ and $L_n$, an increase rate of the width $W_n$ of the second impurity region 12 may change so as to increase near the short side 6b. For example, in (e) of FIG. 14, the photosensitive region 6 is equally divided into three sections.

In a section which is the closest to the short side 6b among sections obtained by equally dividing the photosensitive region 6 into three sections, an increase rate of a width of the second impurity region 12E is not constant but changes so as to become larger near the short side 6b. The photosensitive region 6 may be equally divided into two sections or may be equally divided into four or more sections. The expression, "near the short side 6b" means, for example, to be closer to the short side 6b than the center line CL in the second direction D2 in the section that is the closest to the short side 6b.

Each of the photoelectric conversion sections 5 does not necessarily have the long shape. Each of the photoelectric conversion sections 5 may include a plurality of the photosensitive regions 6. Each of the photoelectric conversion sections 5 may include a plurality of pixels. Even in a case in which the photoelectric conversion section 5 includes the plurality of photosensitive regions 6, an electrical potential gradient of each of the photosensitive regions 6 becomes approximately constant, and thus, the solid state imaging device 1 improves the charge transfer efficiency.

INDUSTRIAL APPLICABILITY

The present invention can be used for a CCD linear image sensor.

REFERENCE SIGNS LIST 1 solid state imaging device
5 photoelectric conversion section
6 photosensitive region
6a short side
6b short side
7 transfer section
11 first impurity region
12 second impurity region
D1 first direction
D2 second direction
TD transfer direction
G1 center line
W width

The invention claimed is:

1. A solid state imaging device comprising: a plurality of photoelectric conversion sections including photosensitive regions and distributed in a first direction, the photosensitive regions being arranged to generate a charge in response to incident light; and a plurality of transfer sections distributed in a second direction intersecting the first direction with respect to corresponding photoelectric conversion sections of the plurality of photoelectric conversion sections and arranged to transfer the charge generated in the corresponding photoelectric conversion sections, wherein the photosensitive region includes a first impurity region of a first conductivity type, a second impurity region of the first conductivity type located in a layer in which the first impurity region is located and having a higher impurity concentration than that of the first impurity region, a third impurity region of a second conductivity type, opposite the first conductivity type, located in a layer different from the layer in which the first and second impurity regions are located, and a fourth impurity region of the second conductivity type located in a layer different from the layer in which the first, second and third impurity regions are located, wherein the first and second impurity regions are between the third impurity region and the fourth impurity region, the first and second impurity regions forming a pn junction with the third impurity region, the photosensitive region including one end positioned away from the transfer section in the second direction and another end positioned closer to the transfer section in the second direction, the second impurity region is provided from the one end of the photosensitive region or a vicinity of the one end to the other end of the photosensitive region, and has a shape that is line-symmetric with respect to a center line of the photosensitive region along the second direction in plan view, a width of the second impurity region in the first direction increases in a transfer direction from the one end to the other end, an increase rate of the width of the second impurity region in each section of a plurality of sections obtained by dividing the photosensitive region into n sections in the second direction becomes gradually higher in the transfer direction, and n is an integer of two or more, the other end of each photosensitive region is adjacent to a corresponding transfer section of the plurality of transfer sections, and the width of the second impurity region increases up to the other end.

2. The solid state imaging device according to claim 1, wherein
the width of the second impurity region in each of the sections is set such that an electrical potential difference in the photosensitive region between adjacent sections of the sections is constant.

3. The solid state imaging device according to claim 1, wherein
each of the sections is a section obtained by equally dividing the photosensitive region into n sections in the second direction, and n is an integer of two or more.

4. The solid state imaging device according to claim 1, wherein
each of the sections is a section obtained by dividing the photosensitive region such that a width in the second direction becomes gradually narrower in the transfer direction.

5. The solid state imaging device according to claim 1, wherein
an increase rate of the width of the second impurity region changes in such a manner as to increase near the other end in the section closest to the other end.

6. The solid state imaging device according to claim 1, further comprising:
a semiconductor substrate including a semiconductor layer of the second conductivity type, wherein
the third impurity region includes the semiconductor layer, and
the first and second impurity regions are located on the semiconductor layer.

7. The solid state imaging device according to claim 1, wherein
in each section of the plurality of sections, the width of the second impurity region monotonously increases.

* * * * *